United States Patent [19]

Krimmel

[11]  4,208,668

[45]  Jun. 17, 1980

[54] CHARGE COUPLED DEVICE WITH BURIED ZONES IN A SEMICONDUCTOR SUBSTRATE FOR USE ESPECIALLY AS A LIGHT SENSOR

[75] Inventor: Eberhard Krimmel, Pullach, Fed. Rep. of Germany

[73] Assignee: Siemens Aktiengesellschaft, Berlin & Munich, Fed. Rep. of Germany

[21] Appl. No.: 884,902

[22] Filed: Mar. 9, 1978

[30] Foreign Application Priority Data

Mar. 29, 1977 [DE] Fed. Rep. of Germany ....... 2713876

[51] Int. Cl.² .................... H01L 29/78; H01L 29/56; G11C 19/28
[52] U.S. Cl. ........................................ 357/24; 357/15; 357/91; 307/221 D
[58] Field of Search ................ 357/24, 91; 307/221 D

[56] References Cited

U.S. PATENT DOCUMENTS

| 3,999,208 | 12/1976 | Shimizu | 357/24 |
| 4,032,952 | 6/1977 | Ohba et al. | 357/24 |

OTHER PUBLICATIONS

Sequin, "Blooming Suppression in Charge Coupled Imaging Devices", Bell System Technical Journal, vol. 51, (10/72), pp. 1923–1926.

Bankowski et al., "Charge-Coupled Device Scanner...", IBM Technical Disclosure Bulletin, vol. 16, (6/73), pp. 173–174.

Shimizu et al., "Charge-Coupled Device with Buried Channels Under Electrode Gaps", Appl. Phy. Lett., vol. 22, (3/73), pp. 286–287.

Sequin et al., *Charge Transfer Devices*, Academic Press, N.Y., pp. 19–31.

*Primary Examiner*—Gene M. Munson
*Attorney, Agent, or Firm*—Hill, Van Santen, Steadman, Chiara & Simpson

[57] ABSTRACT

A CCD is disclosed having a semiconductor substrate of a first conductivity type with a plurality of electrodes serially located above one planar surface thereof, a plurality of buried doped zones of a conductivity type opposite to that of the substrate and located in a plane spaced below a surface of the substrate. The rear edge of each electrode is in line with the front edge of a buried doped zone. The front edge of the same electrode overlaps the rear end of the next succeeding buried doped zone. The upper front corner of each electrode is bevelled.

2 Claims, 6 Drawing Figures

CHARGE COUPLED DEVICE WITH BURIED ZONES IN A SEMICONDUCTOR SUBSTRATE FOR USE ESPECIALLY AS A LIGHT SENSOR

BACKGROUND OF THE INVENTION

1. Field of the Invention:

The invention relates to a charge-coupled device, and more particularly to a CCD which is especially suited for use as a light sensor; and to a method of making the same.

2. Description of the Prior Art:

Charge coupled elements are known components in semiconductor technology (see, for example, Siemens Forschungs- and Entwick-lungsberichte, Vol. 4, 1975, pages 226 ff; German OS No. 2,201,150). It is further known that charge coupled elements can be used as light sensors (see, for example, "IBM Tech. Disc. Bull.", Vol. 16, No. 1, June 1973, pages 173—174 and "Bell System Technical Jl.", Oct. 1972, pages 1923-1926). CCD circuits of this type fundamentally consist of a series of MIS capacitors, each of which MIS-capacitors are constructed in such manner that on the surface of a semiconductor substrate there is applied an electrical insulating layer which bears an electrode. CCD-components of this type can be used, for example, as a store or as radiation sensors for light. At least in each MIS-capacitor, a radiation-transmissive point must be provided in the electrode through which radiation can penetrate into the substrate. The radiation produces change carries in the substrate. When an appropriate voltage is connected between the substrate terminal of the element and the relevant electrode of a MIS-capacitor, these charge carriers can be accumulated in this capacitor in the substrate beneath the capacitor electrode. When sensors of this kind are used to record very weak radiation intensities, it proves disadvantageous that the radiation which, in the sensor, produces the pairs of charge carriers required for recording, must pass through electrodes of such a MIS-capacitor and through the insulating layer into the semiconductor, as both in the electrode and the insulating layer a part of the radiation is already absorbed and thus is no longer available for the production of charge carriers in the semiconductor substrate.

The aim of the invention is to provide a CCD which can be used as a charge store or as a radiation sensor (e.g., for light or ionizing radiation) and which can be used even with weak radiation intensities. As a result of its design, it obviates the need for radiation which forms the pairs of charge carriers to pass through one of the electrodes of this CCD.

BRIEF SUMMARY OF THE INVENTION

The present invention is based on the following considerations: the buried, doped zones which lie below the gaps of the electrode and which possess a doping which is opposite to that of the substrate can serve to store a charge if, in the case of a p-substrate and n-doped buried zones, the electrodes are connected to a negative potential relative to the doped zones so that the potential barrier which is thus formed prevents an exchange of charge between the individual buried, doped zones. This negative potential can be achieved either by means of an external voltage source or by means of contact potential differences in the case of Schottky electrodes. The one-sided overlap of the electrodes with the interlying, buried doped zones produces an asymmetry of the arrangement which, for example when a positive voltage is connected to one of the electrodes, means that the charge sored in a buried, doped zone of this type can only flow in one direction into the adjacent, buried, doped zone. As a result, this component can be operated as a CCD.

A preferred use of this CCD in accordance with the invention consists in use as light sensor or sensor for other radiations, as the active storage zones which are formed by the buried, doped zones are not covered by an absorbant electrode. Furthermore, the insulating layer can be removed in the intermediate zone between the electrodes; in the case of Schottky electrodes it can also be entirely absent. A further advantage of this CCD component in accordance with the invention consists in that its production requires only one single mask step, and that therefore the mask adjustment processes which normally require a high outlay can be omitted from the production.

In the following, the invention will be described and explained in detail making reference to preferred embodiments which are illustrated in the Figures.

DESCRIPTION OF PREFERRED EMBODIMENTS

Figure 1:
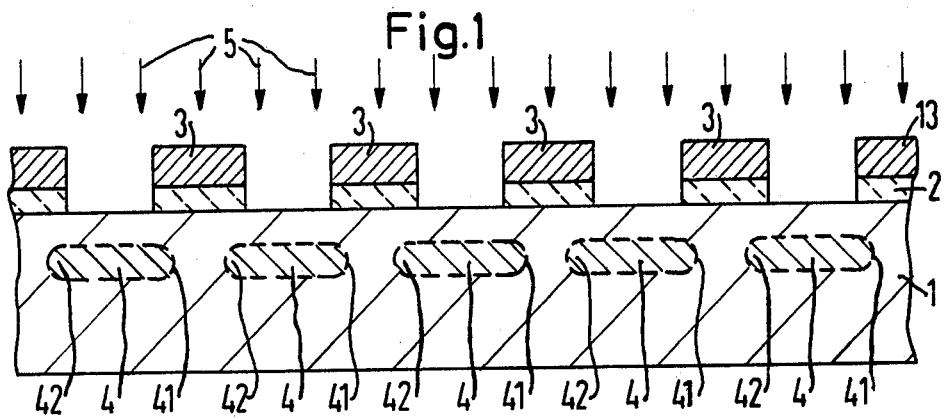
FIGS. 1 and 2 schematically illustrate the production process for the CCD component in accordance with the invention.
Figure 2:
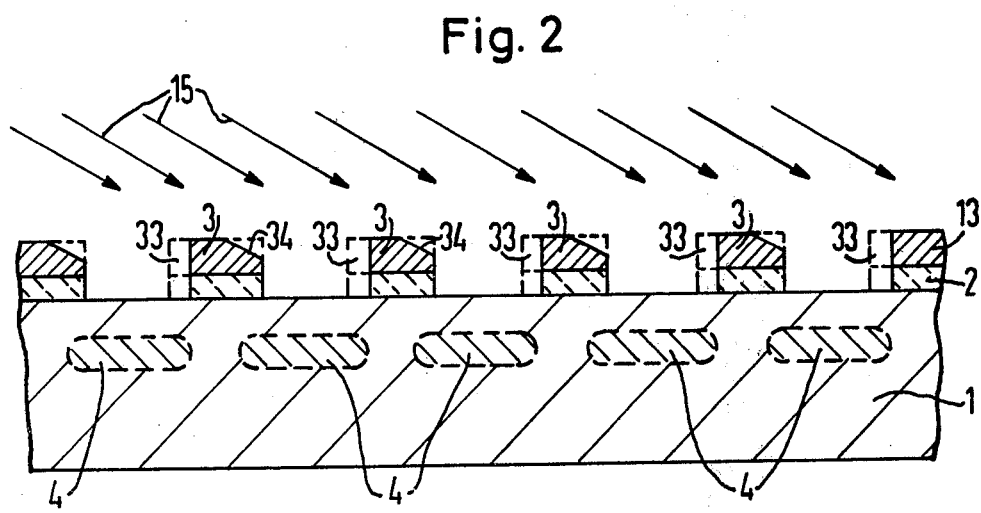
Figure 3:
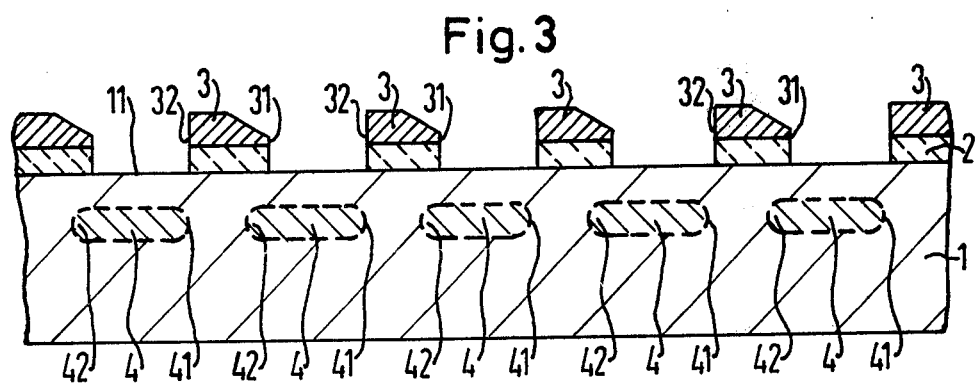
FIG. 3 schematically illustrates a preferred embodiment of the CCD component in accordance with the invention.

The production of a CCD in accordance with the invention in a MOS-technique will serve as an example. On a semiconductor substrate 1, for example a silicon substrate which is p-doped, with a carrier concentration of $10^{14}$ cm$^{-3}$, there is deposited a silicon dioxide layer 2 having a thickness of approximately 120 nm. An electrode layer 13, for example an aluminum layer, is deposited onto this silicon dioxide layer 2. Using a photolithographic technique, the electrodes 3 of the CCD are then etched out of this aluminum layer. The electrodes 3 have a spacing between one another of as little as 1 to 2 $\mu$m. Then the doped, buried zones 4 are produced. These zones 4 are arranged at a depth of between approximately 50 nm and 1 $\mu$m beneath the substrate surface. This is effected by employing ion implantation, e.g., phosphorus ions 5 which are injected at an acceleration voltage of between 30 and 800 keV and in an irradiation dose of more than approximately $10^{12}$ cm$^{-2}$ into the substrate. The doping of these buried zones 4 is "self-adjusting" as the electrodes 3 of the CCD which remain upon the insulating layer serve as an implantation mask. As the implantation profile in the semiconductor substrate is not exactly delimited by the shadow zone of the electrodes 3 arranged on the insulating layer, but also, as a result of the deceleration occurring in the substrate of the implanted ions, also has a lateral extent and therefore extends into the shadow zones of the masks, relative to the surface normal of the substrate 1, an overlap occurs between the buried, doped zones 4 and the electrodes 3. This can also occur as a result of diffusion phenomena during the heating process which is necessary in order to activate the implanted particles serving to drive the doping profile even further into the shadow zone of the mask 3. The extent of the overlap zone is preferably in the order of the distance of the buried zones 4 from the substrate surface; in the quoted example it amounts to between approximately 50 nm and 1 μm. In the next stage of the production process, an ion etching is carried out on the electrodes 3 arranged upon the insulating layer. This ion etching is carried out with ions 15 delivered obliquely, so that the rear, edge zone 33 of the electrodes illustrated in broken lines in FIG. 2 is removed. The front edge zone 34 of these electrodes is bevelled in wedge shape (FIG. 2). As a result of this ion etching process, the component acquires the structure shown in FIG. 3 in which the electrodes 3 and the buried, doped zones 4 overlap only on one side.

Figure 4:
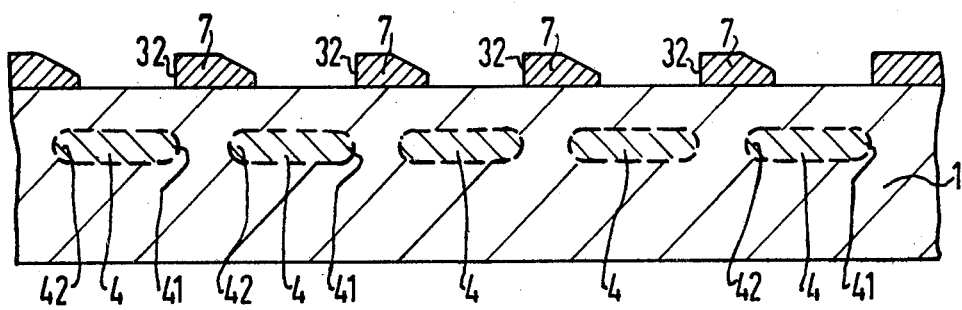
FIG. 4 shows an alternative embodiment with Schottky electrodes.

FIG. 4 illustrates an alternative embodiment of the CCD in accordance with the invention, wherein Schottky electrodes are arranged on the substrate surface. In this case no insulating layer is present on the substrate surface 11 so that the light can enter the semiconductor substrate completely unobstructed.

Figure 5:
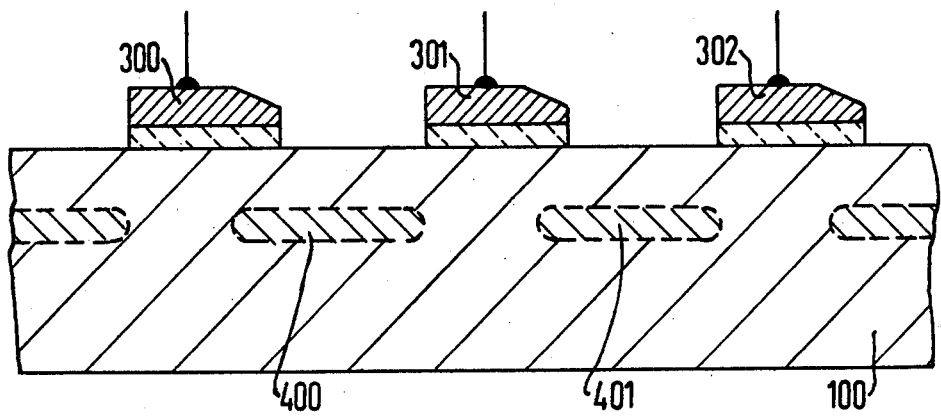
FIGS. 5 and 5A schematically illustrate the operation of the CCD component in accordance with the invention.
Figure 5A:
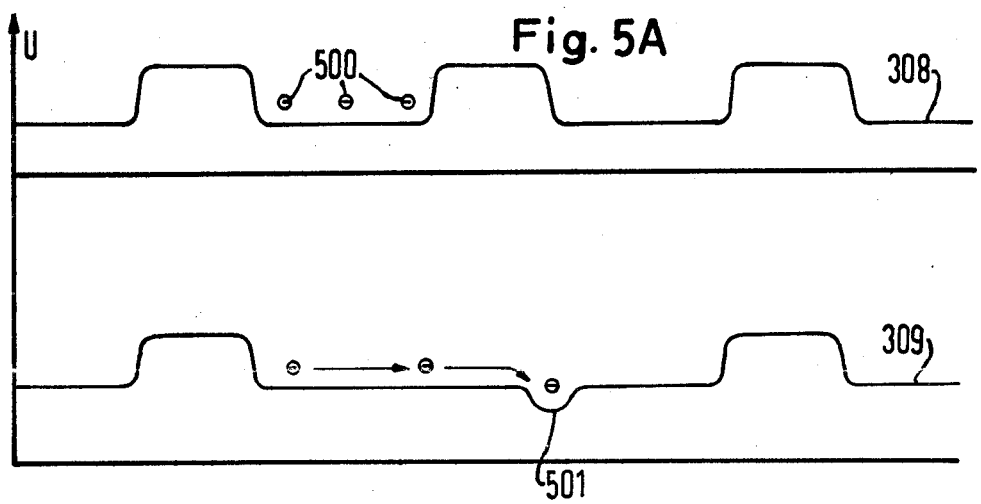

Making reference to FIGS. 5 and 5A, the fundamental mode of operation of the CCD in accordance with the invention will now be explained. FIG. 5A schematically illustrates the structure of the CCD element in accordance with the invention, with the electrodes 300, 301 and 302 and with the buried, doped zones 400 and 401 arranged in the substrate. FIG. 5A schematically illustrates the course of the potential U for electrons present in the substrate, in two storage states. The line 308 represents a potential course for a state in which each of the electrodes 300, 301 and 302 is connected to a potential which is negative relative to the buried, doped zones 400 and 401. Radiation or incident light between the electrodes 300 and 301 serves to produce pairs of charge carriers, the electrons 500 of these pairs of charge carriers gathering in the n-doped zone 400, whereas the positive holes flow away to the substrate 100. The line 309 in FIG. 5 illustrates a potential course for a charge shift process. For this purpose the negative potential connected to the electrodes 300 and 302 is maintained and the electrode 301 is connected not to a negative potential but to a potential which is positive in such a manner that the potential barrier beneath the electrode 301 is broken down. As a result of the overlap zone between the electrode 301 and the buried doped zone 401, an additional potential well 501 is formed. This additional potential well serves to accumulate the charge carriers. If, in the next step of the operating process, the electrode 301 is reconnected to the negative potential, the electrons present in the potential well 501 can no longer flow back into the potential well between the electrodes 300 and 301.

During the operation of the CCD in accordance with the invention, those elements of the CCD which enable the read-out and forwarding of the information governed by the value of the shifted charge, can be protected from the radiation which is to be identified by means of screening. This ensures that during the further transportation of the charge produced by the radiation out of a specific zone of the sensor, this quantity of charge is not changed by further formation of charge carrier pairs produced in the read-out section as a result of radiation.

It will be apparent to those skilled in the art that many modifications and variations may be effected without departing from the spirit and scope of the novel concepts of the present invention.

I claim as my invention:

1. A charge coupled device (CCD) comprising a semiconductor substrate of a first conductivity type and a plurality of electrodes arranged in spaced series relationship above said substrate, to form a plurality of capacitors therewith, said substrate having therein a plurality of buried, doped zones of a second conductivity type, also arranged in spaced series relationship, said electrodes being adapted to have potentials applied thereto to store and transfer charges in a given direction, said buried zones being so arranged with respect to said electrodes that, considered in the charge shift direction in use of the device, the front edge of any electrode of the series lies directly above the rear edge of a buried zone considered in the direction normal to the substrate surface, while the rear edge of said electrode overlaps the front edge of the next buried layer in the series, said electrodes being formed on said substrate as Schottky electrodes.

2. A charge coupled device (CCD) comprising a semiconductor substrate of a first conductivity type and a plurality of electrodes arranged in spaced series relationship above said substrate, to form a plurality of capacitors therewith, said substrate having therein a plurality of buried, doped zones of a second conductivity type, also arranged in spaced series relationship, said electrodes being adapted to have potentials applied thereto to store and transfer charges in a given direction, said buried zones being so arranged with respect to said electrodes that, considered in the charge shift direction in use of the device, the front edge of any electrode of the series lies directly above the rear edge of a buried zone considered in the direction normal to the substrate surface, while the rear edge of said electrode overlaps the front edge of the next buried layer in the series, the distance of said buried, doped zones from one another being approximately 500 nm.

* * * * *